(12) United States Patent
Schwartz et al.

(10) Patent No.: US 12,738,449 B2
(45) Date of Patent: Sep. 15, 2026

(54) LASER-BASED CONTRAST CONTROL IN TRANSMISSION ELECTRON MICROSCOPY

(71) Applicant: YEDA RESEARCH AND DEVELOPMENT CO. LTD., Rehovot (IL)

(72) Inventors: Osip Schwartz, Rehovot (IL); Michael Kali, Rehovot (IL)

(73) Assignee: YEDA RESEARCH AND DEVELOPMENT CO. LTD., Rehovot (IL)

( * ) Notice: Subject to any disclaimer, the term of this patent is extended or adjusted under 35 U.S.C. 154(b) by 330 days.

(21) Appl. No.: 18/706,003

(22) PCT Filed: Nov. 1, 2022

(86) PCT No.: PCT/IL2022/051157

§ 371 (c)(1),
(2) Date: Apr. 30, 2024

(87) PCT Pub. No.: WO2023/079548

PCT Pub. Date: May 11, 2023

(65) Prior Publication Data

US 2025/0062099 A1 Feb. 20, 2025

Related U.S. Application Data

(60) Provisional application No. 63/274,616, filed on Nov. 2, 2021.

(51) Int. Cl.
*H01J 37/22* (2006.01)
*H01J 37/26* (2006.01)

(52) U.S. Cl.
CPC .......... *H01J 37/226* (2013.01); *H01J 37/263* (2013.01); *H01J 2237/057* (2013.01); *H01J 2237/24485* (2013.01); *H01J 2237/2614* (2013.01)

(58) Field of Classification Search
CPC .. H01J 37/226; H01J 37/263; H01J 2237/057; H01J 2237/24485; H01J 2237/2614
See application file for complete search history.

(56) References Cited

U.S. PATENT DOCUMENTS 8,217,352 B2 7/2012 Reed
10,395,888 B2 8/2019 Axelrod et al.
(Continued)

FOREIGN PATENT DOCUMENTS

WO WO 2021/055217 A1 3/2021

OTHER PUBLICATIONS

Axelrod et al. "Observation of the relativistic reversal of the ponderomotive potential" Physical review letters. May 5, 2020;124(17):174801.

(Continued)

*Primary Examiner* — Nicole M Ippolito
(74) *Attorney, Agent, or Firm* — Mark S. Cohen; PEARL COHEN LLP

(57) ABSTRACT

A system and methods for electron beam imaging or electron beam spectroscopy. The system comprising: a transmission electron microscope (TEM) having a back focal plane; one or more laser-based devices, configured to shift a predetermined portion of an electron wave to an energy that is different from the energy originally provided by the electron source of the TEM; and an electron energy filter that is configured to accept electron waves, at the energy provided by the electron source of the TEM, and further configured to reject electron waves shifted to a different energy by the laser device.

20 Claims, 7 Drawing Sheets

(56) References Cited

U.S. PATENT DOCUMENTS

| | | | | |
|---|---|---|---|---|
| 11,101,101 | B2 | 8/2021 | Buijsse et al. | |
| 2013/0037712 | A1 | 2/2013 | Glaeser et al. | |
| 2014/0297205 | A1 * | 10/2014 | Sarvari | G01N 23/2251<br>702/57 |
| 2017/0082545 | A1 * | 3/2017 | Dake | G01N 21/6445 |
| 2018/0286631 | A1 * | 10/2018 | Axelrod | H01J 37/04 |

OTHER PUBLICATIONS

International Search Report for PCT Application No. PCT/IL2018/051232 dated Feb. 17, 2023.

Schwartz et al. "Near-concentric Fabry-Pérot cavity for continuous-wave laser control of electron waves" Optics express. Jun. 26, 2017;25(13):14453-62.

Schwartz et al. "Laser phase plate for transmission electron microscopy" Nature methods. Oct. 2019;16(10):1016.

Turnbaugh et al. "High-power near-concentric Fabry-Perot cavity for phase contrast electron microscopy" The Review of Scientific Instruments. May 5, 2021;92(5).

* cited by examiner 300
310
330

400
410
430

Near-concentric resonator
with spherical mirrors
Near-concentric resonator
with *aspherical* mirrors
300
310
330
350

400
410
430
450

Temporal profile
Energy spectrum

Before cavity
I
t
ϵ

After cavity

LASER-BASED CONTRAST CONTROL IN TRANSMISSION ELECTRON MICROSCOPY

CROSS-REFERENCE TO RELATED APPLICATIONS

This application is a National Phase Application of PCT International Application No. PCT/IL2022/051157, International Filing Date Nov. 1, 2022, claiming the benefit of U.S. Patent Application No. 63/274,616, filed Nov. 2, 2021, which are incorporated in their entirety herein by reference.

BACKGROUND OF THE INVENTION

Transmission electron microscopy (TEM) is an essential tool of materials science and life sciences. In particular, the development of cryo-electron microscopy (cryo-EM) led to rapid progress in structural biology and was celebrated with the 2018 Nobel prize in chemistry.

The rapid progress in cryo-EM was fueled by the development of direct electron detectors, and the sample preparation and handling techniques, as well as the gradual improvement of the data processing software. At the same time, the electron optics of the TEM have been evolving incrementally. Apart from the development of aberration correctors (which are not widely used in cryo-EM), the optical design of the TEM has only changed moderately over the last 10-20 years.

A key feature of cryo-EM, as well as any TEM imaging of samples composed of light elements, is that the samples are mostly transparent to the electron beams. The structure of the specimen is imprinted in the phase of the electron beam passing through it, but since detectors are sensitive only to electron flux and not to the phase, a well-focused image of a phase object contains almost no information about the object. The conventional solution to this is that most images are taken with a defocused imaging system, which transfers some of the phase information into detectable amplitude modulation. However, this works efficiently for high spatial frequency information, while low frequency information remains unavailable. In addition, the contrast transfer function (CTF) is oscillatory, meaning that less than half of all the information is recoverable.

Potentially a better solution, widely used in optical microscopy, is known as Zernike phase contrast (Nobel prize 1953). This approach is based on changing the relative phase between the wave scattered by the specimen (which contains the information about the specimen) and the part of the illumination wave that is transmitted through the specimen without change (the unscattered wave). This requires shifting the phase of the unscattered wave by 90 degrees, which can be readily achieved in light microscopy using an optical phase retardation plate (or simply phase plate). The quest to create a phase plate for electron microscopy has been underway since 1947.

A major advance was the development of the Volta phase plate, based on thin carbon foil. However, it provides a phase shift that is changing with accumulated electron exposure, which creates practical difficulties. It was also found to attenuate the useful signal to some degree.

Recently, a group at UC Berkeley demonstrated an implementation of a phase plate for electron microscope based on electron interaction with a laser field. In this approach, in-focus phase contrast imaging is provided using ponderomotive retardation of the unscattered wave. In that work, the necessary high laser intensity was achieved by using a high-finesse optical cavity that resonantly enhanced the laser power. The type of cavity used was a near-concentric resonator, which supports modes with a tight focus. That system reached a laser intensity sufficient to impart a 90-degree phase-shift to a 300 keV electron beam. The TEM used for that experiment, was equipped with a special transfer (magnetic) lens, which created an additional plane conjugated to the back focal plane of the TEM's objective, with an additional six-fold magnification. The cavity was integrated with the microscope by suspending it so that the focal point of the cavity was placed in the center of the conjugate back focal plane.

However, even at the optimal phase shift, cryo-EM images suffer from extremely low contrast. Whether the images are obtained with defocus-based phase contrast or using a phase plate, gray level variation across the image remains small relative to the average. This is a consequence of cryo-EM samples being weak phase objects, i.e., the phase imparted by the sample to the electron beam being small.

The low contrast places significant limitations e.g., on the rate of data acquisition, critical for cryo-EM microscopes that operate as multi-user facilities and must ration imaging time. The leading electron detection technology, direct electron cameras, operate in electron counting regime and can only process a limited number of electrons per unit time. Because the vast majority of detected electrons are background electrons, the micrograph acquisition time is a major throughput bottleneck. Another detrimental effect of low contrast is that it hinders the development of proportional detectors in TEM. The high background means that only a small part of the dynamic range of a detector can be used.

SUMMARY OF THE INVENTION

In some embodiments of the invention, a new system is provided for electron beam imaging or for electron beam spectroscopy, the system comprising:

- a transmission electron microscope (TEM), comprising an electron source configured to provide an electron beam;
- at least one laser-based device configured to provide at least one laser beam, wherein the laser beam is configured to shift a predetermined portion of the electron beam to an energy spectrum that is different from the energy spectrum originally provided by the electron source; and
- an electron energy filter, configured to reject electron beams having the different energy spectrum, while allowing the passage of electron beams having the original energy spectrum.

In some embodiments of the invention, the laser-based device is positioned: at about a back focal plane of the TEM; or at about a plane that is conjugate to the back focal plane.

In some embodiments of the invention, the provided laser beam/s is/are continuous-wave laser beam/s.

In some embodiments of the invention, the predetermined portion of the electron beam is a predetermined portion of an unscattered electron wave of the electron beam.

In some embodiments of the invention, the laser beam is further configured to provide a predetermined phase shift to a portion of the electron beam.

In some embodiments of the invention, the laser-based device is configured to create a laser focal spot, and to locate the laser focal spot at about the back focal plane of the TEM, or at about the conjugate plane, and wherein the laser-based device is positioned to allow an unscattered electron wave of the electron beam to pass through the focal spot.

In some embodiments of the invention, the material structure of the laser-based device is configured and positioned such that the electron beam of the TEM is at least 0.1 mm or at least 1 mm or at least 10 mm away from any material element of the laser-based device.

In some embodiments of the invention, the laser-based device and the energy filter are configured to attenuate the electron beam in the TEM to a predetermined beam current, and/or to attenuate the electron beam by a predetermined attenuation factor.

In some embodiments of the invention, the laser-based device and the energy filter are configured to attenuate the unscattered electron wave in the TEM to a predetermined amplitude, and/or to attenuate the unscattered electron wave by a predetermined attenuation factor.

In some embodiments of the invention, TEM further comprising an electron detector positioned at an image plane of the TEM and configured to receive the electron beam.

In some embodiments of the invention, wherein the laser-based device comprises at least one optical resonator.

In some embodiments of the invention, each optical resonator is at least one of:

comprising two or more mirrors;

is configured to admit a laser beam;

is positioned at about the back focal plane of the TEM, or at about a plane that is conjugate to the back focal plane of the TEM;

is configured to allow the electron beam, provided by the TEM, to pass through it;

and any combination thereof.

In some embodiments of the invention, at least one optical resonator is an aspherical near-concentric resonator comprising aspherical mirrors.

In some embodiments of the invention, the laser beam provided by the laser-based device is non-monochromatic.

In some embodiments of the invention, the non-monochromatic laser beam is provided by a configuration of coupling two or more laser beams having different wavelengths into one optical resonator.

In some embodiments of the invention, the non-monochromatic laser beam is provided by a configuration of two or more optical resonators with overlapping focal spots.

In some embodiments of the invention, the resonator is tilted with respect to the optical axis of the TEM; or the optical axis of the resonator is tilted with respect to the optical axis of the TEM; or the direction of the laser beam propagation in the resonator is tilted with respect to the optical axis of the TEM.

In some embodiments of the invention, a new method is provided for electron beam imaging or electron beam spectroscopy comprising:

providing the system according to any one of the above-mentioned embodiments;

attenuating the portion of the electron beam, via the laser-based device and the energy filter, to a predetermined beam current, and/or attenuating the electron beam by a predetermined attenuation factor.

In some embodiments of the invention, another new system is provided for electron beam imaging or for electron beam spectroscopy, the system comprising:

a transmission electron microscope (TEM), comprising an electron source configured to provide an electron beam;

at least one laser-based device configured to provide at least one laser beam, wherein the laser beam is configured to shift a predetermined portion of the electron beam to a momentum that is different from the momentum originally provided to the predetermined portion of the electron beam by the TEM; and an aperture, configured to reject the electron beams shifted to the different momentum by the laser-based device, while allowing the passage of electron beams having the original momentum provided by the TEM.

In some embodiments of the invention, the laser-based device is positioned: at about a back focal plane of the TEM; or at about a plane that is conjugate to the back focal plane.

In some embodiments of the invention, the predetermined portion of the electron beam is a predetermined portion of an unscattered electron wave of the electron beam.

In some embodiments of the invention, a new method is provided for electron beam imaging or electron beam spectroscopy comprising:

providing the another system according to any one of the above-mentioned embodiments;

attenuating the unscattered electron wave in the TEM, via the laser-based device and the aperture, to a predetermined amplitude, and/or attenuating the unscattered electron wave by a predetermined attenuation factor.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figures 1, 2:
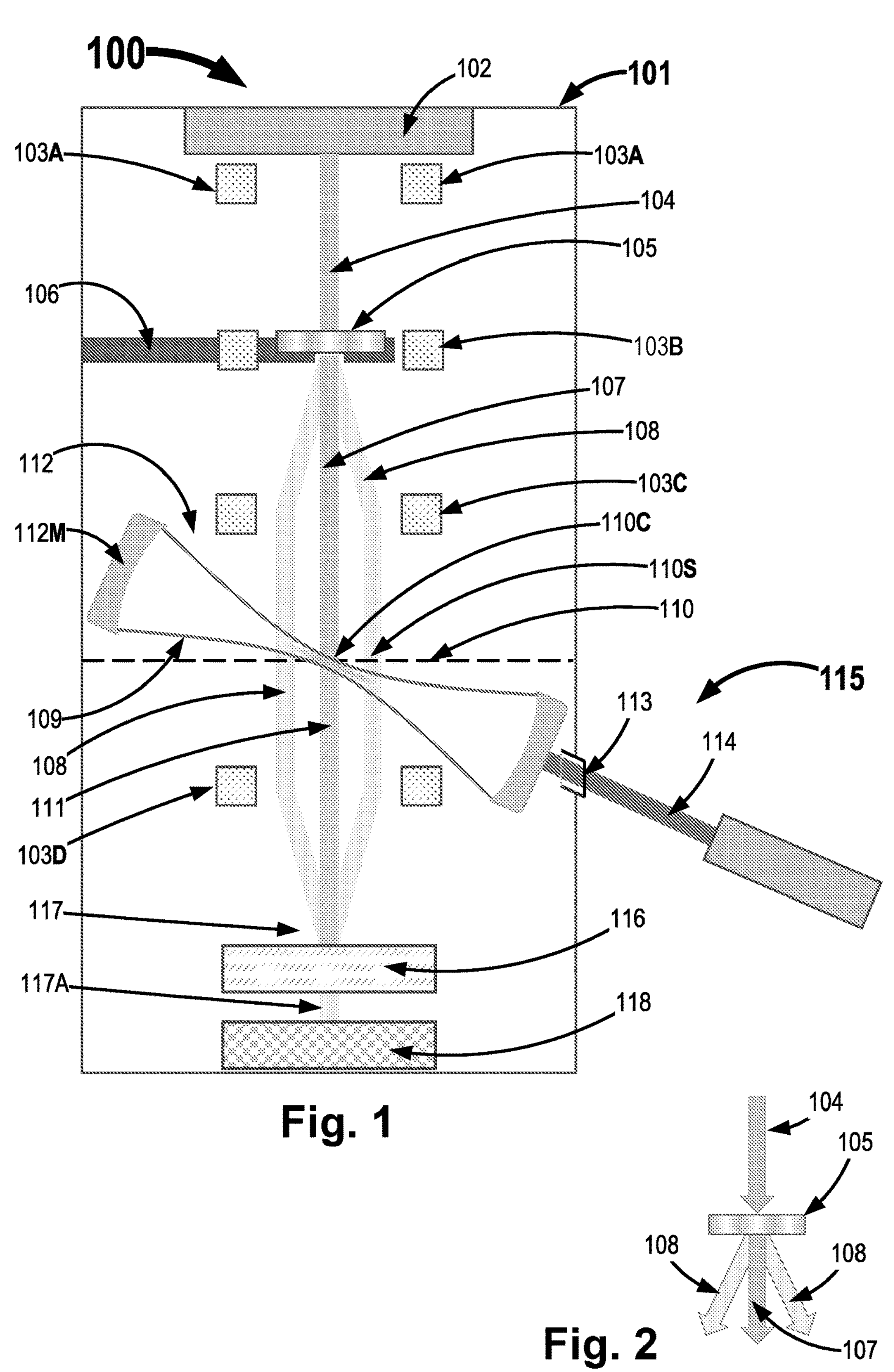
FIG. 1 is a schematic view of the system for electron beam imaging or for electron beam spectroscopy, according to some embodiments of the invention.
FIG. 2 is a schematic view of the relations between the illumination electron beam, the unscattered wave, and the scattered waves, according to some embodiments of the invention.

It will be appreciated that for the sake of clarity, elements shown in the figures may not be drawn to scale and reference numerals may be repeated in different figures to indicate corresponding or analogous elements.

DETAILED DESCRIPTION OF THE INVENTION

The present subject matter may be understood more readily by reference to the following detailed description which forms a part of this disclosure. It is to be understood that the invention is not limited to the specific products, methods, conditions or parameters described and/or shown herein, and that the terminology used herein is for the purpose of describing particular embodiments by way of example only and is not intended to be limiting of the claimed invention. Further, unless otherwise required by context, singular terms shall include pluralities and plural terms shall include the singular.

Embodiments of the presently disclosed subject matter are directed, inter alia, to laser-based control of electron beams/waves, with the goal of improving various aspects of electron-based microscopy and spectroscopy.

As used herein, in some embodiments the terms "cavity", "optical cavity", "resonator", "optical resonator" may be used interchangeably having all the same meanings and qualities.

As used herein, in some embodiments, the term "wave" and "beam" may be used interchangeably having the same meanings and qualities.

As used herein, in some embodiments, the term "electron gun" and "electron source" may be used interchangeably having the same meanings and qualities.

As used herein, in some embodiments, the term "object" and "sample" may be used interchangeably having the same meanings and qualities.

In optical phase contrast microscopy, the problem of low contrast is addressed by Zernike plate attenuating the unscattered wave, in addition to applying a phase shift (The unscattered wave forms the image background). It is attenuated to a level where it becomes comparable in amplitude with the scattered wave, which results in a high-contrast image. This attenuation converts the microscope from an unbalanced imaging interferometer to a balanced one. However, no effective attenuator exists for TEM.

Reference is now made to FIG. 1, disclosing a schematic view of a new system for electron beam imaging of a sample and/or for electron beam spectroscopy, according to some embodiments of the invention. The system [100] comprises:

- a transmission electron microscope (TEM) [101], comprising an electron gun [102] configured to provide an electron beam [104];
- at least one laser-based device [115] configured to provide at least one laser beam [114], wherein the laser beam [114] is configured to shift a predetermined portion of the electron beam to an energy spectrum that is different from the energy spectrum originally provided by the electron gun [102] of the TEM [101]; and
- an electron energy filter [116], configured to accept (allow passage of) electron beams at the energy spectrum originally provided by the electron gun of the TEM, and to reject electron beams, at the shifted energy spectrum, shifted by the laser-based device [115]; thereby to attenuate the unscattered wave [107] of the received electron beam [117]. It is noted that, beam [117] denotes the recombined: scattered waves [108] and unscattered wave [107], recombined in this example via lens [103D]).

According to some embodiments, in the case of a laser-based device providing more than one laser beam, their combined action is configured to change the energy spectrum of the predetermined portion of the electron beam.

According to some embodiments, the predetermined portion is a predetermined percentage of a component of the electron beam, where according to some embodiments, the component of the electron beam is at least one of:

- an unscattered electron wave,
- a scattered electron wave,
- a group of scattered electron waves,
- a group of electron waves that can be selected from the electron beam, by spatial filtering, and
- any combination thereof.

According to some embodiments, the predetermined percentage is selected from: between 0.01%-1%, between 1%-10%, between 10%-50%, between 50%-90%, between 90%-99%, between 99%-99.99%, and any combination thereof.

According to some embodiments, the electron energy filter is configured to reject at least 50%, or at least 90.0%, or at least 99.0%, or at least 99.9% of the electron beams having the shifted energy spectrum.

According to some embodiments, the TEM comprises a plurality of lenses [103A-103D], configured to condition and direct the electron beam [104] to illuminate an object or a sample [105] being imaged; the object/sample can be supported and/or positioned via a sample holder [106]. According to some embodiments, the plurality of lenses are magnetic lenses.

FIG. 1 and FIG. 2 demonstrate that, due to the interaction of the illumination electron beam [104] with the sample [105], a portion of the illumination electron beam is scattered, forming a plurality of scattered waves [108], while the other portion of the illumination beam, which is not scattered by the interaction with the object, forms an unscattered wave [107].

FIG. 1 further demonstrates that, according to some embodiments, the unscattered wave [107] is focused by magnetic lenses [103B,103C] in the center [110C] of the back focal plane [110]. It is also demonstrated that the scattered waves [108] are focused elsewhere [110S] in the back focal plane [110].

According to some embodiments, the laser-based device [115] is positioned:

- at about the back focal plane [110] of the TEM, meaning at a range of ±1 mm or ±0.1 mm or +0.01 mm or +0.001 mm, of the back focal plane; or
- at about a plane that is conjugate to the back focal plane, meaning at a range of ±1 mm or ±0.1 mm or ±0.01 mm or ±0.001 mm, of the conjugate plane.

According to some embodiments, the laser beam/s [114], provided by the laser gun, is/are continuous-wave laser beam/s.

Embodiments of the invention demonstrate that, the concept of continuously operating spatially selective phase retarder (laser phase plate) for transmission electron microscopy is being extended, providing a spatially selective attenuator for electron beams.

According to some embodiments, the predetermined portion of the electron beam [104] is a predetermined portion of the unscattered electron wave [107] of the electron beam.

According to some embodiments, the laser beam/s is/are further configured to provide a predetermined phase shift to a portion of the electron beam. According to some embodiments, the phase shift is applied/provided to the whole unscattered wave [107].

According to some embodiments and as demonstrated in FIG. 1, the laser-based device is configured to create a laser focal spot [110C], and to locate the laser focal spot at:

about the back focal plane [110] of the TEM, meaning at a range of ±1 mm or ±0.1 mm or ±0.01 mm or ±0.001 mm, of the back focal plane, or about the conjugate plane, meaning at a range of ±1 mm or ±0.1 mm or ±0.01 mm or ±0.001 mm, of the conjugate plane, and wherein the laser-based device is positioned to allow the unscattered electron wave [107] to pass through the focal spot [110C].

According to some embodiments, the laser beam/s is/are selected to have wavelengths between 350 nm and 2000 nm, or between 2000 nm and 15 μm.

According to some embodiments, the material structure of the laser-based device is configured and positioned such that the electron beam of the TEM is at least 0.1 mm or at least 1 mm or at least 10 mm away from any material element of the laser-based device, to avoid electron beam distortion, scattering, and/or dephasing by the interaction with the physical structure of the laser device.

According to some embodiments, the laser-based device [115] and the energy filter [116] are configured to attenuate the electron beam in the TEM to a predetermined beam current, and/or to attenuate the electron beam by a predetermined attenuation factor.

According to some embodiments, the predetermined beam current attenuation factor is selected: between 1 and 3, or between 3 and 10, or between 10 and 30, or between 30 and 100, or between 100 and 300, or between 300 and 1000, or above 1000.

According to some embodiments, the laser-based device [115] and the energy filter [116] are configured to attenuate the unscattered electron wave [107] in the TEM to a predetermined amplitude, and/or to attenuate the unscattered electron wave by a predetermined attenuation factor.

According to some embodiments, the predetermined amplitude attenuation factor is selected: between 1 and 3, or between 3 and 10, or between 10 and 30, or between 30 and 100, or between 100 and 300, or between 300 and 1000, or above 1000.

According to some embodiments, the predetermined beam current is selected: below 1 pA, or below 1 nA, or below 1 μA, or below 1 mA, or below 1 A, or at least 1 pA, or at least 1 nA, or at least 1 μA, or at least 1 mA, or at least 1 A.

According to some embodiments, the predetermined amplitude of the unscattered wave corresponds to a beam current that is selected: below 1 pA, or below 1 nA, or below 1 μA, or below 1 mA, or below 1 A, or at least 1 pA, or at least 1 nA, or at least 1 μA, or at least 1 mA, or at least 1 A.

According to some embodiments and as demonstrated in FIG. 1, the TEM further comprises an electron detector [118] positioned at an image plane of the TEM and configured to receive the electron beam.

According to some embodiments, and as demonstrated in FIG. 1, the laser-based device [115] comprises at least one optical resonator [112].

According to some embodiments each optical resonator:

comprises two or more mirrors [112M];

is configured to admit/couple in a laser beam [109];

is positioned at about the back focal plane [110] of the TEM, meaning at a range of ±1 mm or ±0.1 mm or ±0.01 mm or ±0.001 mm, of the back focal plane, or at about a plane that is conjugate to the back focal plane of the TEM, meaning at a range of ±1 mm or ±0.1 mm or ±0.01 mm or ±0.001 mm, of the conjugate plane;

is configured to allow the electron beam, provided by the TEM, to pass through it.

According to some embodiments and as demonstrated in FIG. 1, the resonator [112] is positioned in the TEM, such that the laser beam inside it [109] has a focal spot [110C] at about the center of the back focal plane [110C] of the TEM, meaning at a range of ±1 mm or ±0.1 mm or ±0.01 mm or ±0.001 mm, of the center of the back focal plane [110C].

According to some embodiments, the laser-based device [115] is configured to provide the laser beam [114] with light at two or more different wavelengths.

According to some embodiments and as demonstrated in FIG. 1, the TEM is equipped with a laser port [113], wherein the laser beam [114] passes through the laser port [113], to enter into the TEM [101] and is further routed, or coupled, into the cavity [112].

According to some embodiments, the interaction of the unscattered electron wave [107] with the laser beam [114] transfers a portion of the unscattered wave to energies different from energy originally provided by the electron source of the TEM.

According to some embodiments, and as demonstrated in FIG. 1, after the interaction with the laser beam, the unscattered wave now noted [111] thus comprises a portion of the unscattered wave [107] that has the energy originally provided by the electron gun [102], and a portion that is transferred to different energies. Both the scattered waves [108] and the unscattered wave [111] are then directed to the energy filter [116], which is configured to remove the energy-shifted portion of the unscattered wave [111], thus attenuating it.

According to some embodiments, the energy provided to the electron beams, by the TEM's electron gun [102] is selected between 10 KeV and 500 KeV.

According to some embodiments, and as demonstrated in FIG. 1, the scattered waves [108] and the attenuated unscattered waves [107] are then recombined by the TEM and the recombined beam, forming an image of the sample/object, is then directed to the electron detector [118].

Figures 3A, 3B, 4A, 4B:
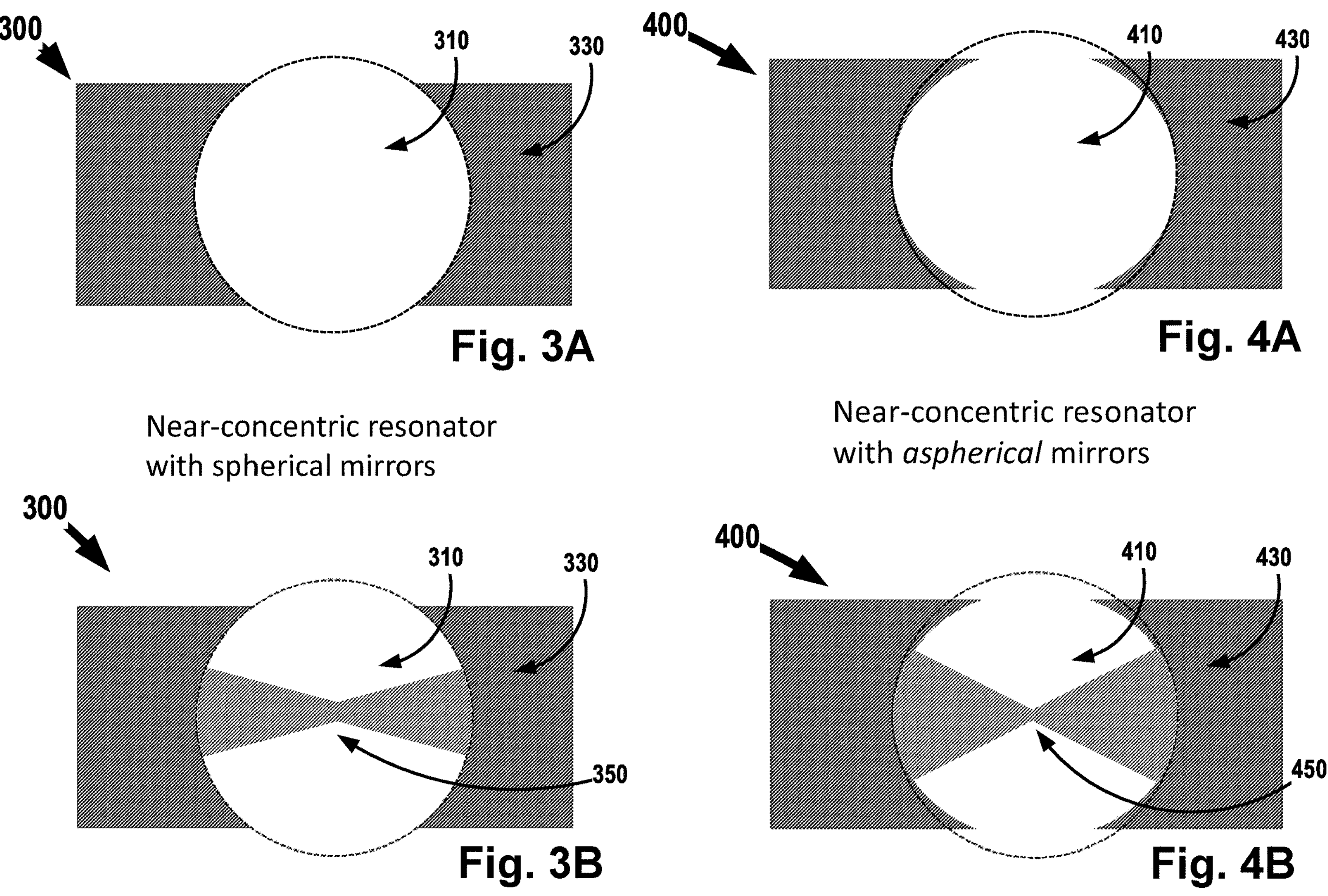
FIGS. 3A-3B are schematic views of a near-concentric resonator with spherical mirrors, according to some embodiments of the invention.
FIGS. 4A-4B are schematic views of a near-concentric resonator with aspherical mirrors according to some embodiments of the invention.

According to some embodiments and as demonstrated in FIGS. 4A and 4B, at least one optical resonator is an aspherical near-concentric comprising aspherical mirrors [430].

According to some embodiments, the laser beam [114] provided by the laser-based device [115] is non-monochromatic. According to some embodiments, the non-monochromatic laser beam is provided by a configuration of coupling two or more laser beams having different wavelengths into one optical resonator. According to some other embodiments, the non-monochromatic laser beam is provided by a configuration of two or more optical resonators with overlapping focal spots.

Figures 5A, 5B:
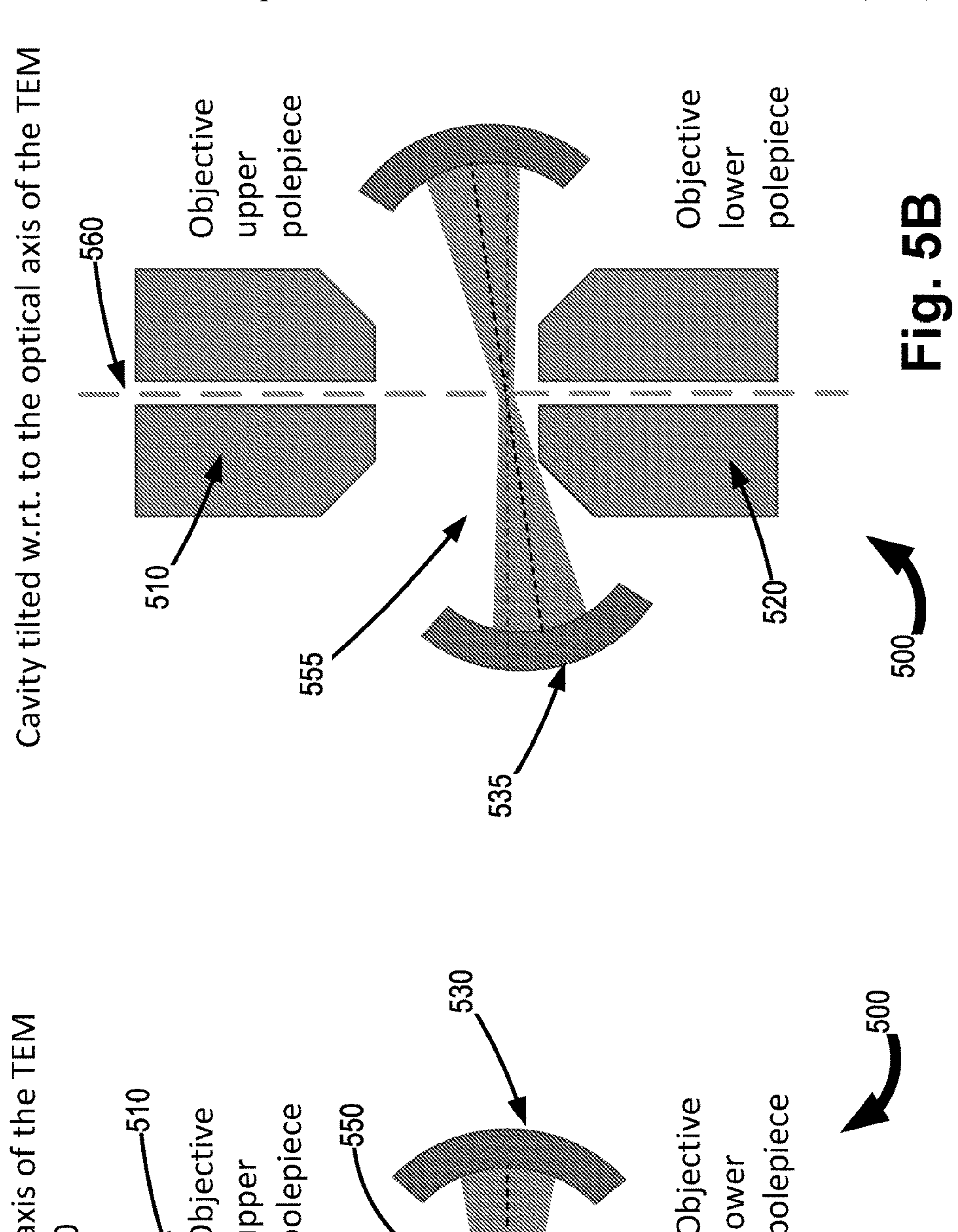
FIGS. 5A-5B are schematic views of a part of a system with a cavity orthogonal to optical axis of the TEM (FIG. 5A), according to some embodiments of the invention, and a cavity tilted with respect to optical axis of the TEM (FIG. 5B), according to some other embodiments of the invention.

According to some embodiments, the cavity [112] is tilted with respect to the optical axis of the TEM [560, FIG. 5B]; or the optical axis of the cavity is tilted with respect to the optical axis of the TEM; or the direction of the laser beam propagation in the cavity is tilted with respect to the optical axis of the TEM.

Reference is now made to FIG. 3A that demonstrates a schematic view of a near-concentric resonator [300], comprising two mirrors [330], whose surfaces have a spherical shape, according to some embodiments of the invention. In the case demonstrated, the two mirrors have surfaces with the same radius of curvature. In this case, the near-concentric configuration of the resonator is achieved when the two mirrors are positioned so that their two spherical surfaces lie almost on the same (imaginary) sphere [310], which has the same radius as the radius of curvature of the surfaces of the mirrors. Note that the resonator is only stable when the two spherical surfaces of the mirrors are positioned inside the imaginary sphere [310].

FIG. 3B demonstrates the same schematic view of a near-concentric resonator as demonstrated in FIG. 3A but with a laser beam [350] shown inside of the resonator, according to some embodiments of the invention.

FIG. 4A demonstrates a schematic view of a near-concentric aspheric resonator [400], according to some embodiments of the invention, which differs from the conventional near-concentric resonator of FIG. 3A in that it comprises mirrors [430] that have aspheric shapes. In the case shown, the two mirrors have the same shapes. In this case, the near-concentric configuration is achieved when the two mirrors are positioned so that the central portion of their surfaces, which are approximately spherical, lie almost on the same (imaginary) sphere [410], which has the same radius as the radius of curvature of the central parts of the surfaces of the mirrors.

FIG. 4B demonstrates the same schematic view of an aspheric near-concentric resonator as shown in FIG. 4A, but with a laser beam [450] shown inside the resonator, according to some embodiments of the invention. The main advantage of the aspheric near-concentric resonator is that it may achieve a higher numerical aperture, and, correspondingly, a smaller focal spot size, than a conventional near-concentric resonator with spherical mirrors.

FIG. 5A is a schematic view of a part of a system, according to some other embodiments of the invention, demonstrating an optical resonator [530], orthogonal to the optical axis [560] of the TEM [500]. In this example realization, the cavity [530] is positioned in the back focal plane (demonstrated by the fine dashed line) of the TEM's objective lens [510]. The objective lenses comprise, among other components, the upper pole piece [510] and the lower pole piece [520]. Also demonstrated is a laser beam [550] inside the cavity [530], having a focal spot at the intersection of the optical axis [560] with the back focal plane.

FIG. 5B is a schematic view of a part of a system, according to some embodiments of the invention, that is similar to the system demonstrated in FIG. 5A, with the difference that in this realization the cavity [535] is tilted by a predefined angle with respect to the optical axis of the TEM [560]. Correspondingly, in this case, the laser beam [555] inside the cavity [535] intersects the optical axis [560] of the TEM at a predefined angle.

Figure 6:
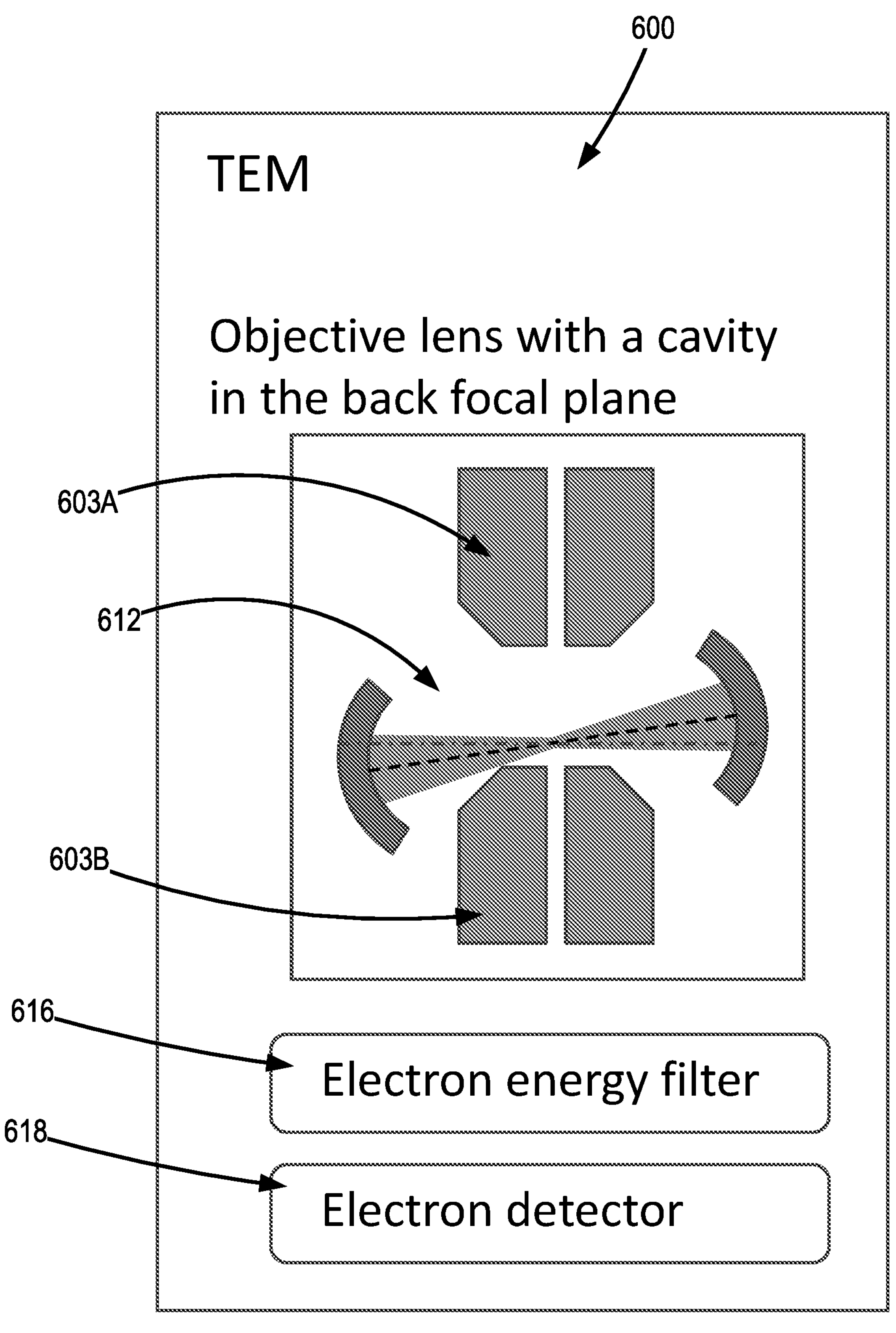
FIG. 6 is a schematic view of the TEM system, according to some embodiments of the invention.

FIG. 6 demonstrates a TEM system [600], according to some embodiments of the invention, containing a cavity [612] in the back focal plane of the objective lens; the cavity is configured to partially shift the energy of the unscattered electron wave; the electron energy filter [618] is configured to remove the components of the unscattered wave that have shifted energy. According to some embodiments, the remaining component of the unscattered wave at the original energy interferes with the scattered wave creating an image in the electron detector [618] with optimized contrast.

Figure 7:
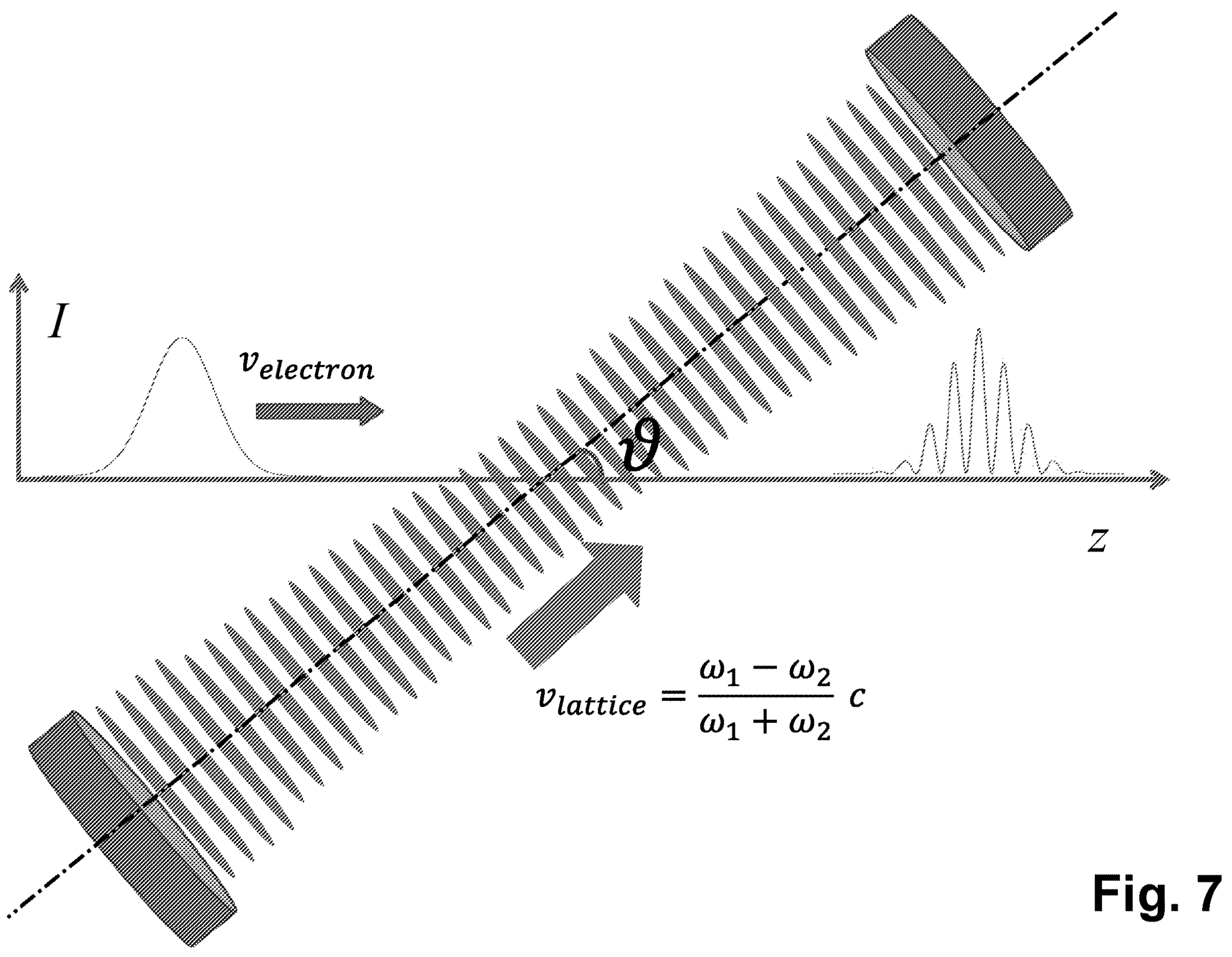
FIG. 7 is a schematic view of a bichromatic cavity, according to some embodiments of the invention.
Figures 8A, 8B, 8C, 8D:
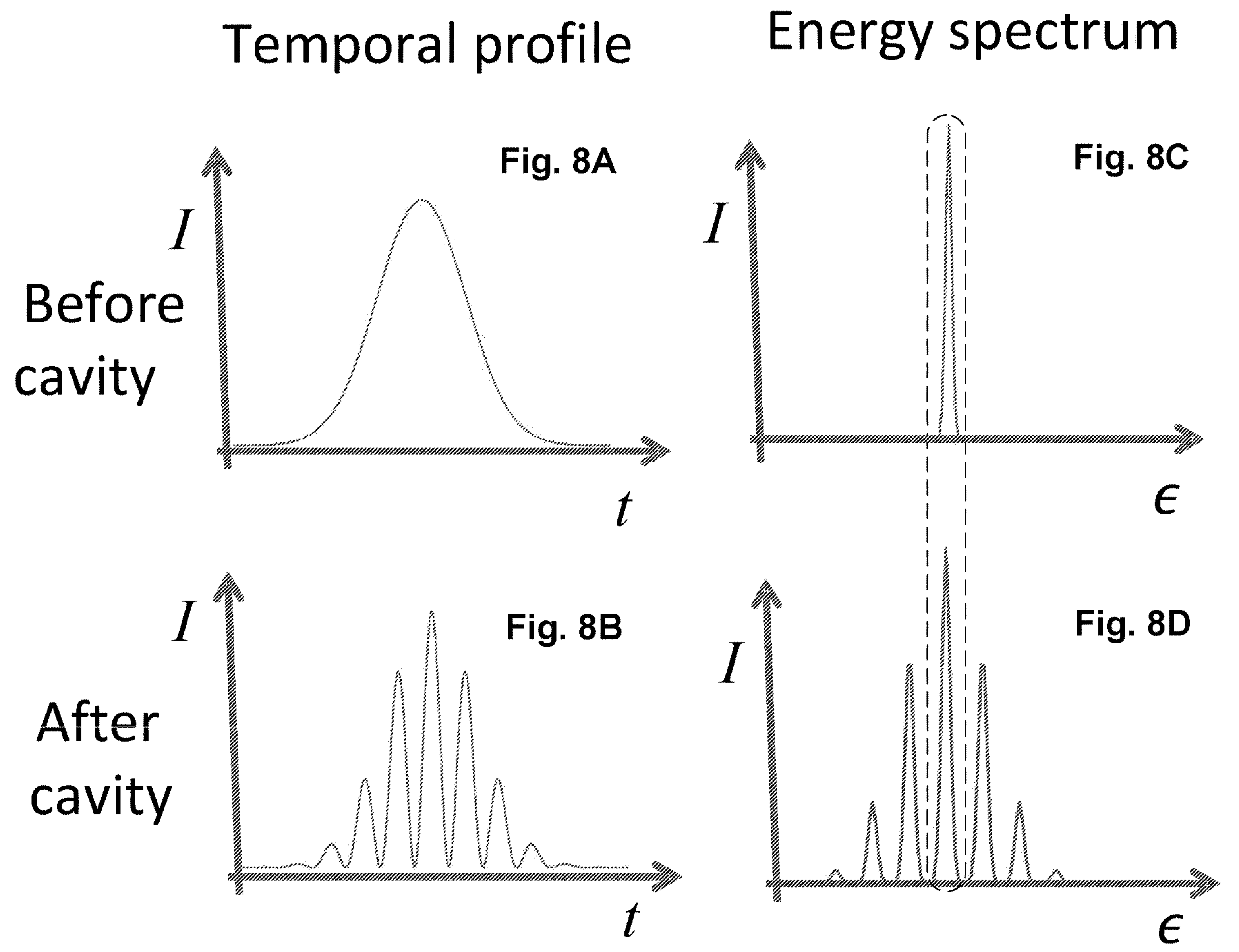
FIGS. 8A-8D are schematic views of the temporal profile (FIGS. 8A-8B) and the energy spectrum (FIGS. 8C-8D) of an electron beam, before and after it interacts with a two-frequency laser beam inside the cavity, according to some embodiments of the invention.

FIG. 7 is a schematic view of a bichromatic cavity, according to some embodiments of the invention. The demonstrated bichromatic cavity has two laser beams at different frequencies circulating inside it, forming four optical lattices (two standing waves and two propagating ones); only one optical lattice is shown in the figure, with the propagation direction indicated by the red arrow; an electron beam propagating across the cavity focus can be efficiently temporally modulated, if its velocity satisfies the condition:

$$v_{electron}\cos\vartheta = v_{lattice},\ \text{where}\ v_{lattice} = \frac{\omega_1 - \omega_2}{\omega_1 + \omega_2}$$

c is the optical lattice velocity, $v_{electron}$ is the electron's velocity, $\vartheta$ is the angle between them, and $\omega_1$ and $\omega_2$ are the frequencies of the two laser beams coupled into the cavity. The electron's interaction with a tilted bichromatic cavity is illustrated by the transformation of its wave packet shape from a smooth, Gaussian-like wavepacket before the interaction, to an oscillating waveform downstream of the interaction region. The oscillating waveform develops due to the interference of the components of the electron beam having different energy; and FIGS. 8A-8D are schematic views of the temporal profile (FIGS. 8A-8B) and the spectrum (FIGS. 8C-8D) of an electron wave, before and after it interacts with a two-frequency laser beam inside the cavity, according to some embodiments of the invention. As shown, after the interaction (as in FIGS. 8B and 8D) the temporal profile of the electron's wave function demonstrates interference of different energy components, and the electron's energy spectrum acquires sidebands. According to some embodiments, the electron wave can be attenuated by spectrally selecting (e.g. using a post-column spectrometer) only the electrons remaining at the original energy, where the range of energies selected by the energy filter is circled in FIGS. 8C and 8D.

According to some embodiments, the invention comprises a laser device achieving simultaneous phase shift and attenuation of the unscattered wave, which is configured to solve the problem of low contrast for cryo-EM. Such embodiments can realize Zernike phase contrast in transmission electron microscopy.

According to some embodiments, the technology of ponderomotive phase manipulation, in continuous free-space electron beams, is extended to enable optically controlled deflection, temporal modulation, and attenuation of electron waves. Experimental realizations may include a custom-modified TEM, with cavity-enhanced laser beams deployed to manipulate electron waves, both before and after the specimen plane.

According to some embodiments, the TEM is configured to enable the operation of an enhancement cavity in the back focal plane of the objective or in a conjugate plane, with sufficient space between the laser devices to allow for insertion of the specimen holder and an anti-contamination device (cryo-box). The TEM can be custom-modified to provide sufficient space for the cavity, while allowing for TEM operation.

According to some embodiments, the unique aspect of the present invention realization based on CW lasers, is that it allows for ponderomotive manipulation of a continuous electron beams in free space. According to some embodiments, the continuous mode of operation is configured to benefit from the high coherence and high average beam current, afforded by field emission electron guns (FEG). At the same time, the free space electron-laser interaction enables keeping the electron beam away from any material surfaces that may cause dephasing or scattering. According to some embodiments, the combination of these two factors is configured to enable laser manipulation in a state-of-the-art TEM, without impairing its ability for atomic-resolution imaging and Angstrom-scale focusing of the electron beam.

According to some embodiments, the laser-based device includes two near-concentric cavities, capable of reaching a focal laser intensity of the order of $10^{12}$ W/cm$^2$. According to some embodiments, the cavities support two wavelengths, e.g., 1064 nm and 532 nm, with input beams provided by a dual-output CW laser system, such as, e.g. a fiber laser system that provides a 1064 nm beam and a frequency-doubled beam. According to some embodiments, the laser system and the locking electronics are modeled on the existing laser-cavity frequency locking technology. According to some embodiments, the cavities are equipped with a micro-positioning system that enables their placement in the back focal plane of the objective lens for electron phase manipulation, respectively, before and after the interaction with the specimen. According to some embodiments, the suspension system is also configured to enable adjustment of the cavities orientation relative to the TEM optical axis, to enable velocity matching between the electrons and the traveling optical lattice in the two-color cavity.

According to some embodiments, the time-dependent ponderomotive potential in a cavity, excited with two monochromatic laser beams, can be used to provide an energy shift to an electron beam in a spatially selective manner.

According to some embodiments, for efficient modulation, the velocity of the electrons needs to be matched to the moving optical lattice formed by a pair of counterpropagating waves with unequal frequency. For example, using the wavelengths of 1064 nm and 532 nm (for these wavelengths, high power CW lasers and cavity mirror coatings are readily available), the cavity needs to be tilted relative to the beam direction by an angle that satisfies the following condition:

$$v_{electron}\cos\vartheta = v_{lattice}, \text{ where } v_{lattice} = \frac{\omega_1 - \omega_2}{\omega_1 + \omega_2}$$

c is the optical lattice velocity, $v_{electron}$ is the electron's velocity, $\vartheta$ is the angle between them, and $\omega_1$ and $\omega_2$ are the frequencies of the two laser beams coupled into the cavity. Alternatively, according to some embodiments, a pair of monochromatic cavities at appropriate angles can be used.

According to some embodiments, a focus of the laser beam is positioned in the center of the back focal plane of the TEM, so that the interaction with the laser beam only affects the unscattered wave and the lowest spatial frequencies comprising the image, up to a cut-on spatial frequency determined by the size of the focus and the objective focal length.

According to some embodiments, attenuation can be combined with the optimal phase shift of the unscattered wave, by tuning the input powers or polarizations of the laser beams at the two frequencies. According to some embodiments, while the product of the two electric fields determines the depth of the temporal modulation, the sum of the two intensities determines the phase shift of the unscattered wave component at the original energy. Thus, according to some embodiments, a single bi-chromatic cavity can serve both as a phase shifter and an attenuator of the unscattered beam, in a close analogy to Zernike plate in optical microscopy.

According to some embodiments, suppressing the unscattered wave entirely by shifting its amplitude entirely to energy sidebands results in dark field microscopy. According to some embodiments, in this case, the image is not formed as a result of the interference of the scattered wave with a reference wave (unscattered wave) but is instead proportional to the beam current density of the scattered electron wave arriving at each point in the image plane. According to some embodiments, although in the ideal case dark-field microscopy is equivalent to phase contrast imaging from the shot noise perspective, dark field exploration is motivated e.g., by the fact that this imaging modality is less sensitive to defocus, which can make it more practical to operate close to focus.

One negative practical effect of the low contrast (or high background) is that most of the electrons collected by electron detectors in a TEM are background electrons, so detectors need to process many electrons to get a useful image. Conversely, the benefit of increasing the image contrast would be that the same amount of useful information can be conveyed with fewer electrons. The leading electron detection technology is direct electron cameras, which operate in electron counting regime and can only process a limited number of electrons per unit time. As many cryo-EM centers and facilities are working towards maximizing their throughput and eliminating time inefficiencies and overheads, image acquisition time emerges as the fundamental bottleneck. According to some embodiments, an imaging system with a higher contrast is configured to allow for an image acquisition speedup of more than an order of magnitude.

According to some embodiments, such an increase in throughput can also be used to collect image data at a higher magnification (which means a reduced effective pixel size). Reduced pixel size in cryo-EM can bring about an increase in the modulation transfer function at high spatial frequencies, resulting in improved signal-to-noise ratio and increased data quality. Normally, reducing the pixel size, corresponding to capturing a smaller field of view, comes at the cost of a reduction of the throughput of a TEM. However, this reduction can be more than compensated by the increase in the speed of data acquisition enabled by the increased image contrast.

Embodiments of the presently disclosed subject matter are directed, inter alia, to a laser-based device configured to provide, in combination with an electron energy filter, an electron wave attenuator for TEM.

According to some embodiments, the laser device transfers apart of the electron wave to a different energy. Accordingly, the part of the wave that has a shifted energy is rejected by the energy filter.

According to some of the above-mentioned embodiments, the new attenuator is configured to provide at least one desirable feature selected from:

Negligible or low scattering of electrons (elastic and/or inelastic);

Not susceptible to charging and/or damage by the electron beam;

Having sufficient spatial selectivity for attenuation of the unscattered wave, without attenuating the information-carrying scattered wave; this can also be described as the attenuator having a low cut-on frequency;

Controllable (tunable) level of attenuation;

Compatibility with a laser phase plate or being able to function as a laser phase plate in addition to attenuation. The device should be able to simultaneously apply an optimal phase shift and an optimal attenuation to the unscattered wave;

Being able to attenuate the unscattered wave to zero amplitude (a negligible residual amplitude) for dark-field imaging;

Compatibility with widely used models of TEMs via retrofitting or light modification of the TEM;

Negligible or low side effects on the imaging system, such as increased aberrations or other detrimental features in the CTF;

Requiring a minimal amount of input laser power; and any combination thereof.

According to some embodiments of the invention a system for electron beam imaging or electron beam spectroscopy, is provided. The system comprising:

a transmission electron microscope (TEM) having a back focal plane;

one or more optical resonators (i.e., optical cavities) configured to provide a continuously tunable attenuation of electron waves, each optical resonator comprising two or more mirrors, a focal spot of the optical cavity positioned at the back focal plane of the TEM (or a conjugate plane), the optical cavity positioned to allow the unscattered wave provided by the TEM to pass through the focal spot of the optical cavity, and the optical cavity being operable to admit a laser beam;

a laser coupled to the optical cavity and operable to provide a laser beam of a specified wavelength to enter the optical cavity, and an electron detector positioned in the image plane of the TEM configured to receive the electron beam, wherein the unscattered wave is phase shifted and/or attenuated by the laser beam.

According to some embodiments, and as demonstrated for example in FIGS. 3A-3B, 4A-4B, 5A-5B and 6, the new system [600] further comprises one or more of the following:

A new type of an optical resonator: an aspherical near-concentric resonator [400], configured to enable a smaller focal spot [450] inside the cavity. A comparison between spherical and aspherical non-concentric resonators is provided in FIGS. 3A-3B vs. 4A-4B. According to some embodiments, the small spot size is configured to enhance the ability to address a particular part of the electron beam.

A configuration of laser beams created using one or more optical cavities [530,535], configured to enable spatially selective interaction with the electron beam [560]. According to some embodiments, the laser beam is configured in such a way that the unscattered wave experiences an energy shift and/or a momentum shift. More specifically, according to some embodiments, the laser beam transforms the unscattered electron wave into a coherent superposition of an electron wave at the original energy and momentum with a reduced amplitude, and a plurality of waves at different energies and/or momenta.

According to some embodiments, the system includes an aperture configured to remove (reject) the parts of the unscattered wave that have shifted momenta as a result of interaction with the laser beam.

According to some embodiments, the system includes an energy filter [616], e.g., of the type that is normally used in TEM to remove the inelastically scattered electrons. According to some embodiments, the filter removes the components of the unscattered wave that have been shifted to a different energy, by the laser beam.

According to some embodiments, the electron microscope [600] is specifically configured to enable the integration of a laser device in-, or near-, the back focal plane of the objective lens, or a conjugate plane. According to some embodiments, the features of the electron microscope include:

An objective lens [510,520] of the TEM having a back focal plane positioned at least a certain distance above the apex of the lower pole-piece [520], configured to enable the placement of the laser device in the back focal plane, according to some embodiments; or having a back focal plane positioned at least a certain distance below the apex of the lower pole-piece, and having mechanical features (such as, e.g., an aperture) configured to enable the placement of the laser device in the back focal plane of the objective lens, according to some other embodiments.

Access to a plane in the microscope conjugate to the back focal plane, with suitable magnification for installation of the laser device An anti-contamination device (such as e.g., a cryo-box) that is shaped and positioned in such a way configured to allow enough space for the laser device.

Ports for insertion of the laser device, or for coupling to the laser device of in-going or outgoing laser beams, optical fibers, or electrical cables.

According to some embodiments of the invention it is possible to reach a small mode waist using near-concentric resonators, but the requirements for their manufacturing tolerances become impractical at a mode size of a few microns. According to some embodiments, a small deviation from a spherical shape (asphericity) leads to a more stable mode behavior, so that a substantially smaller mode waist can be achieved with current technology compared to conventional (spherical) near-concentric resonators. According to some embodiments, the desired aspherical surface is rotationally symmetric and has a positive fourth order term. According to some embodiments, non-rotationally symmetric surfaces can also be used, resulting in mode waist being narrow in only one of the two transverse directions.

While it can be challenging to manufacture (polish) a mirror substrate that has the necessary high curvature, low roughness, and an appropriate aspherical shape, according to some embodiments, several techniques can be employed to generate the desired aspheric shape on a substrate that is polished, using a technology for making spherical concave substrates. The following pathways are given as examples:

Polishing a stressed substrate, with stress created by a compressive ring or another method to induce elastic deformation. After polishing the elastic deformation relaxes, resulting in the desired aspherical shape.

Polishing a substrate consisting of a material with anisotropic thermal expansion tensor, such as Sapphire, at a temperature different than the operating temperature. The anisotropic thermal expansion will induce asphericity.

Applying a mechanically or thermally induced stress field during operation.

Producing the mirror substrates by imprinting a spherical surface that is shaped into the desired shape by applying mechanically or thermally induced stress during the imprinting.

According to some embodiments, the laser device can generate non-monochromatic light, comprising beams at two or more wavelengths. According to some embodiments, the non-monochromatic laser beam generates a time-dependent ponderomotive potential. According to some embodiments, the ponderomotive potential can form a moving system of fringes (optical grating) that has a velocity matched to the velocity of the electrons in the unscattered wave. The enhanced interaction during the propagation of the unscattered wave through the ponderomotive potential efficiently attenuates (depletes) the amplitude of the unscattered wave at the original energy or momentum, while generating a plurality of waves at different energy or momenta that can be removed by apertures or an energy filter.

According to some embodiments, a desired configuration of the laser beam is created by coupling of the laser beams at two or more different wavelength into one cavity, where the cavity is designed to support both wavelengths. Alternatively, according to some embodiments, two or more cavities can be used, where monochromatic or polychromatic light is coupled into each cavity. According to some embodiments, the difference in wavelength needs to be sufficient so that the energy shift imparted to the unscattered can be larger than the resolution of the energy spectrometer or the energy spread of the electron gun. In some embodiments, the cavities can be tilted to create the field configuration necessary for the function of laser attenuator.

One example embodiment can be described as follows: a laser system comprising a seed laser and a fiber amplifier provides a laser beam at a wavelength of 1064 nm and a frequency-doubled beam at a wavelength of 532 nm. The laser beams are coupled into a cavity that is installed at the back focal plane of a TEM operating at an accelerating voltage of 300 keV. The cavity is positioned so that its focal spot (the location with maximum intensity of laser light) is located at the intersection of the optical axis and the back focal plane of the TEM. The cavity is tilted with respect to the optical axis of the cavity by an angle of approximately 65 degrees, which allows for velocity matching between the electrons and one of the moving laser lattices generated in the cavity. The interaction between the laser beam and the electrons partially transfers the unscattered electron beam to energies that differ from the original energy of the electrons in the TEM, generating energy sidebands. The energy sidebands are separated from the original energy by the difference between the photon energies corresponding to the two wavelengths used (and multiples of that energy difference). In the case of 532 nm and 1064 nm, the photon energy difference between the two wavelengths is 1.17 eV. Correspondingly, the sidebands are separated from the original energy by ±1.17 eV, ±2.33 eV, etc. The energy filter of the TEM can remove the portion of the unscattered wave that is transferred to the sidebands if the sideband separation is larger than the resolution of the energy filter, combined with the width of the energy distribution provided by the electron source. In this example realization, an energy filter slit width that corresponds to a spectral width of 1 eV will be effective in suppressing the sidebands while admitting all or most of the portion of the unscattered wave that remains at the original energy.

According to some embodiments, the laser-based device comprises a cavity or cavities that support bidirectional propagation of light waves (these can also be referred to as standing wave cavities); according to some embodiments, the laser-based device comprises a cavity or cavities that support unidirectional propagation of light waves (these can also be referred to as running wave cavities or ring cavities).

According to some embodiments, the laser attenuator is configured to attain the functionality of the phase plate, by creating a field configuration where the average of the time-dependent ponderomotive potential is tuned to provide an optimal phase shift of the unscattered wave.

According to some embodiments, the use of cavities is configured to minimize the input laser power. However according to some embodiments, if a high-power laser beam (containing light at two or more wavelengths) is available (e.g., in a pulsed configuration) it can also be used to create a suitable laser beam configuration.

According to some embodiments, these developments can have an immediate impact on cryo-electron microscopy (cryo-EM), as a key method in structural biology. Since cryo-EM samples tend to be weak phase objects, they are best observed with Zernike phase contrast, which requires phase retardation and attenuation of the unscattered electron wave. With phase retardation some embodiments of the invention can increase the image contrast in interferometric TEM by tunable attenuation of the unscattered wave. According to some embodiments, the regime of complete removal of the unscattered wave is demonstrated, which enables dark-field imaging.

According to some embodiments, a method for electron beam imaging or electron beam spectroscopy is provided, comprising: providing the system [100] according to any one of the above-mentioned and below-mentioned system [100] embodiments; and attenuating the unscattered electron wave [107] in the TEM, via the laser-based device and the energy filter, to a predetermined amplitude, and/or attenuating the unscattered electron wave by a predetermined attenuation factor.

Figure 9:
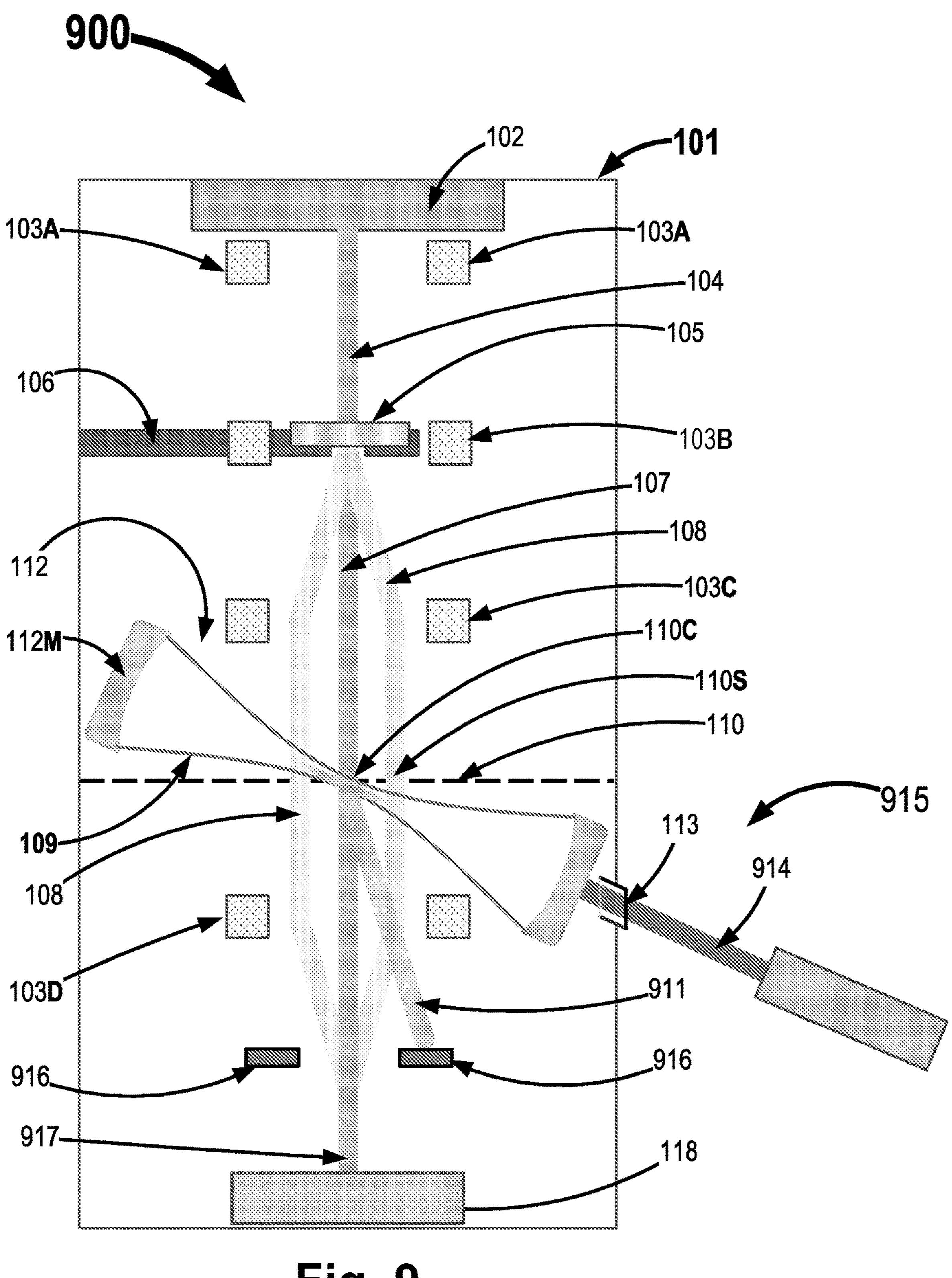
FIG. 9 is a schematic view of another system for electron beam imaging or for electron beam spectroscopy, according to some embodiments of the invention.

According to some embodiments and as demonstrated in FIG. 9, anew system [900] for electron beam imaging or for electron beam spectroscopy is provided, comprising:

- a transmission electron microscope (TEM) [101], comprising an electron source [102] configured to provide an electron beam [104];
- at least one laser-based device [915] configured to provide at least one laser beam [914], wherein the laser beam is configured to shift a predetermined portion of the electron beam to a momentum that is different from the momentum originally provided to the portion of the electron beam by the TEM (demonstrated is a shift to a portion [911] of the unscattered beam [107]); and
- an aperture [916], configured to reject the electron beams shifted to the different momentum by the laser-based device, while allowing the passage of electron beams having the original momentum provided by the TEM.

According to some embodiments, the aperture rejects by absorbing the electron beams shifted to the different momentum by the laser-based device.

According to some embodiments, the predetermined portion is a predetermined percentage of a component of the electron beam, where according to some embodiments, the component of the electron beam is at least one of:

- an unscattered electron wave,
- a scattered electron wave,
- a group of scattered electron waves,
- a group of electron waves that can be selected from the electron beam, by spatial filtering, and
- any combination thereof.

According to some embodiments, the predetermined percentage is selected from: between 0.01%-1%, between 1%-10%, between 10%-50%, between 50%-90%, between 90%-99%, between 99%-99.99%, and any combination thereof.

According to some embodiments, the aperture [916] is configured to reject at least 50% or at least 90% or at least 99% of the electron beams shifted to the different momentum by the laser-based device.

According to some embodiments, the laser-based device [915] is positioned:

- at about a back focal plane [110] of the TEM, meaning at a range of ±1 mm or ±0.1 mm or ±0.01 mm or ±0.001 mm, of the back focal plane; or
- at about a plane that is conjugate to the back focal plane, meaning at a range of ±1 mm or ±0.1 mm or ±0.01 mm or ±0.001 mm, of the conjugate plane.

According to some embodiments, the predetermined portion of the electron beam is a predetermined portion of an unscattered electron wave [107] of the electron beam [104].

As demonstrated in FIG. 9, the shifted portion is denoted [911] and the scattered wave [108] and non-shifted unscattered wave [107], are recombined [917], in this example via lens [103D].

A method for electron beam imaging or electron beam spectroscopy is provided, comprising:

providing the system [900] according to any one of the above-mentioned system [900] embodiments;

attenuating the unscattered electron wave in the TEM, via the laser-based device and the aperture, to a predetermined amplitude, and/or attenuating the unscattered electron wave by a predetermined attenuation factor.

It should be appreciated that embodiments formed from combinations of features set forth in separate embodiments are also within the scope of the presently disclosed subject matter.

While certain features of the presently disclosed subject matter have been illustrated and described herein, modifications, substitutions, and equivalents are included within the scope of the presently disclosed subject matter, mutatis mutandis.

The invention claimed is:

1. A system for electron beam imaging or for electron beam spectroscopy comprising:

a transmission electron microscope (TEM), comprising an electron source configured to provide an electron beam;

at least one laser-based device configured to provide at least one laser beam, wherein the laser beam is configured to shift a predetermined portion of the electron beam to an energy spectrum that is different from the energy spectrum originally provided by the electron source; and an electron energy filter, configured to reject electron beams having the different energy spectrum, while allowing the passage of electron beams having the original energy spectrum.

2. The system of claim 1, wherein the laser-based device is positioned:

at about a back focal plane of the TEM; or at about a plane that is conjugate to the back focal plane.

3. The system of claim 2, wherein the laser-based device is configured to create a laser focal spot, and to locate the laser focal spot at about the back focal plane of the TEM, or at about the conjugate plane, and wherein the laser-based device is positioned to allow an unscattered electron wave of the electron beam to pass through the focal spot.

4. The system of claim 1, wherein the provided laser beam/s is/are continuous-wave laser beam/s.

5. The system of claim 1, wherein the predetermined portion of the electron beam is a predetermined portion of an unscattered electron wave of the electron beam.

6. The system of claim 1, wherein the laser beam is further configured to provide a predetermined phase shift to a portion of the electron beam.

7. The system of claim 1, wherein the material structure of the laser-based device is configured and positioned such that the electron beam of the TEM is at least 0.1 mm or at least 1 mm or at least 10 mm away from any material element of the laser-based device.

8. The system of claim 1, wherein the laser-based device and the energy filter are configured to attenuate the electron beam in the TEM to a predetermined beam current, and/or to attenuate the electron beam by a predetermined attenuation factor.

9. The system of claim 1, wherein the TEM further comprising an electron detector positioned at an image plane of the TEM and configured to receive the electron beam.

10. The system of claim 1, wherein the laser-based device comprises at least one optical resonator.

11. The system of claim 10, wherein each optical resonator:

comprises two or more mirrors;

is configured to admit a laser beam;

is positioned at about the back focal plane of the TEM, or at about a plane that is conjugate to the back focal plane of the TEM;

is configured to allow the electron beam, provided by the TEM, to pass through it.

12. The system of claim 10, wherein at least one optical resonator is an aspherical near-concentric resonator comprising aspherical mirrors.

13. The system of claim 10, wherein:

the resonator is tilted with respect to the optical axis of the TEM; or the optical axis of the resonator is tilted with respect to the optical axis of the TEM; or the direction of the laser beam propagation in the resonator is tilted with respect to the optical axis of the TEM.

14. The system of claim 1, wherein the laser beam provided by the laser-based device is non-monochromatic.

15. The system of claim 14, wherein:

the resonator is tilted with respect to the optical axis of the TEM; or the optical axis of the resonator is tilted with respect to the optical axis of the TEM; or the direction of the laser beam propagation in the resonator is tilted with respect to the optical axis of the TEM.

16. A method for electron beam imaging or electron beam spectroscopy comprising:

providing the system according to claim 1;

attenuating the portion of the electron beam, via the laser-based device and the energy filter, to a predetermined beam current, and/or attenuating the electron beam by a predetermined attenuation factor.

17. A system for electron beam imaging or for electron beam spectroscopy comprising:

a transmission electron microscope (TEM), comprising an electron source configured to provide an electron beam;

at least one laser-based device configured to provide at least one laser beam, wherein the laser beam is configured to shift a predetermined portion of the electron beam to a momentum that is different from the momentum originally provided to the predetermined portion of the electron beam by the TEM; and an aperture, configured to reject the electron beams shifted to the different momentum by the laser-based device, while allowing the passage of electron beams having the original momentum provided by the TEM.

18. The system of claim 17, wherein the laser-based device is positioned:

at about a back focal plane of the TEM; or at about a plane that is conjugate to the back focal plane.

19. The system of claim 17, wherein the predetermined portion of the electron beam is a predetermined portion of an unscattered electron wave of the electron beam.

20. A method for electron beam imaging or electron beam spectroscopy comprising:

providing the system according to claim 17;

attenuating the unscattered electron wave in the TEM, via the laser-based device and the aperture, to a predetermined amplitude, and/or attenuating the unscattered electron wave by a predetermined attenuation factor.

* * * * *